(12) United States Patent
Ikishima et al.

(10) Patent No.: US 7,556,850 B2
(45) Date of Patent: Jul. 7, 2009

(54) WIRING CIRCUIT BOARD

(75) Inventors: Miyoko Ikishima, Osaka (JP); Masahiro Ooura, Osaka (JP)

(73) Assignee: Nitto Denko Corporation, Tokyo (JP)

( * ) Notice: Subject to any disclaimer, the term of this patent is extended or adjusted under 35 U.S.C. 154(b) by 255 days.

(21) Appl. No.: 11/502,386

(22) Filed: Aug. 11, 2006

(65) Prior Publication Data
US 2007/0036954 A1 Feb. 15, 2007

(30) Foreign Application Priority Data
Aug. 11, 2005 (JP) ............... P.2005-233492

(51) Int. Cl.
*B32B 7/12* (2006.01)
*H05K 1/02* (2006.01)
(52) U.S. Cl. .............. 428/41.5; 428/347; 428/349; 428/355 R; 174/259; 361/762
(58) Field of Classification Search ............ 428/209, 428/41.5, 347, 349, 355 R; 174/259; 361/762
See application file for complete search history.

(56) References Cited

U.S. PATENT DOCUMENTS

| 3,822,175 A | 7/1974 | Yuan |
|---|---|---|
| 3,900,662 A | 8/1975 | Yuan |
| 7,390,544 B2 * | 6/2008 | Nonaka et al. ............ 428/40.1 |
| 2005/0187348 A1 | 8/2005 | Sonobe et al. |
| 2005/0196574 A1 | 9/2005 | Nonaka et al. |

FOREIGN PATENT DOCUMENTS

| CN | 1642385 A | 7/2005 |
|---|---|---|
| EP | 0989172 A1 | 3/2000 |
| EP | 1 568 748 A1 * | 8/2005 |
| EP | 1 571 191 A2 * | 9/2005 |
| JP | 5-51569 A | 3/1993 |

OTHER PUBLICATIONS

Extended European Search Report for EP 06016724 dated Jan. 26, 2009.
Chinese Office Action dated Mar. 13, 2009.

* cited by examiner

*Primary Examiner*—Cathy Lam
(74) *Attorney, Agent, or Firm*—Sughrue Mion, PLLC

(57) ABSTRACT

A wiring circuit board at least contains an electric insulator layer and an electric conductor formed on the electric insulator layer so as to form a predetermined circuit pattern, which further comprises an adhesive layer formed by thermal hardening of the thermosetting adhesive and pressure-sensitive adhesive composition as described in the specification.

6 Claims, 2 Drawing Sheets

WIRING CIRCUIT BOARD

FIELD OF THE INVENTION

The present invention relates to a wiring circuit board.

BACKGROUND OF THE INVENTION

In electronic devices, wiring circuit boards have been used and, as the wiring circuit boards, flexible printed circuit boards (sometimes referred to as "FPC") have been widely utilized. In such FPC, adhesives are used (1) in the process of manufacturing FPC by adhering and laminating a conductive metal foil such as a copper foil or an aluminum foil to a heat-resistant base material such as a polyimide base material or a polyamide base material and (2) in the process of adhering FPC to a reinforcing plate such as an aluminum plate, a stainless steel plate, or a polyimide plate. As the adhesives for use in such adhesion of FPC, nitrile rubber (NBR)/epoxy resin-based adhesives and acrylic rubber/phenol resin-based adhesives (see, U.S. Pat. Nos. 3,822,175 and 3,900,662) have been widely utilized.

However, since the conventional acrylic rubber/phenol resin-based adhesives have non-pressure-sensitive adhesiveness at ordinary temperature (23° C.), temporary attaching operation cannot be performed at ordinary temperature at adhesion and pressure-sensitive adhesion of FPC in the manufacture of FPC and in the attachment of FPC to a reinforcing plate. Therefore, in a processing line, or the like, a special warming jig is necessary, and thus, a decrease in operating efficiency and danger to worker may accompany. Moreover, when it is intended to impart pressure-sensitive adhesiveness at ordinary temperature to the acrylic rubber/phenol resin-based adhesives, adhesiveness and heat resistance may be lowered and it is difficult to maintain a good balance between adhesiveness and heat resistance since elastic modulus is to be lowered for the impartment of pressure-sensitive adhesiveness.

SUMMARY OF THE INVENTION

Therefore, an object of the invention is to provide a wiring circuit board wherein predetermined members are attached each other with positioning by temporary attachment at ordinary temperature and, after attached at a predetermined positional relation, they are adhered with an excellent adhesiveness.

As a result of extensive studies for achieving the above object, the present inventors have found that, when a thermosetting adhesive and pressure-sensitive adhesive wherein a specific acrylic polymer and a specific phenol resin are combined is used, at adhering predetermined members in a wiring circuit board each other in a predetermined positional relation, the members can be easily attached with positioning by temporary attachment at ordinary temperature and at strongly adhering the members after attached in a predetermined positional relation, the members can be easily adhered with an excellent adhesiveness by performing a heat treatment. The invention has been accomplished based on these findings.

Namely, the invention provide a wiring circuit board at least comprising an electric insulator layer and an electric conductor formed on the electric insulator layer so as to form a predetermined circuit pattern, which further comprises an adhesive layer formed by thermal hardening of the following thermosetting adhesive and pressure-sensitive adhesive composition:

the thermosetting adhesive and pressure-sensitive adhesive composition being a thermosetting adhesive and pressure-sensitive adhesive composition which comprises 100 parts by weight of an acrylic polymer (X) containing, as monomer components, a (meth)acrylic acid alkyl ester (a) where the alkyl group has 2 to 14 carbon atoms in an amount of 60 to 75% by weight relative to the total amount of monomer components, a cyano group-containing monomer (b) in an amount of 20 to 35% by weight relative to the total amount of monomer components, and a carboxyl group-containing monomer (c) in an amount of 0.5 to 10% by weight relative to the total amount of monomer components and 1 to 20 parts by weight of a carbolic acid-based resorcinol-type phenol resin (Y) represented by the following formula (1):

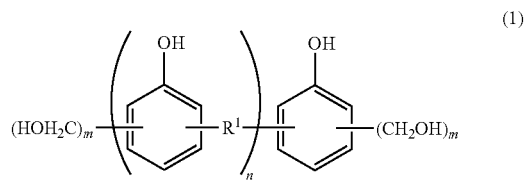

(1)

wherein $R^1$ represents —$CH_2$— or —$CH_2$—O—$CH_2$—, n is a positive integer, and m is an integer of 1 to 4.

It is preferable that the wiring circuit board of the invention has the adhesive layer formed by thermal hardening of the above thermosetting adhesive and pressure-sensitive adhesive composition at least one site among sites between the electric insulator layer and the electric conductor layer, between the electric conductor layer and a covering electric insulator layer provided on the electric conductor layer, and between the electric insulator layer and a reinforcing plate provided on the surface of the electric insulator layer opposite to the electric conductor layer. Moreover, the wiring circuit board may have a multilayer structure where a plurality of wiring circuit boards are laminated and may have the adhesive layer formed by thermal hardening of the above thermosetting adhesive and pressure-sensitive adhesive composition between one set or two or more sets of wiring circuit boards.

The adhesive layer formed by thermal hardening of the above thermosetting adhesive and pressure-sensitive adhesive composition may be formed using a thermosetting adhesive and pressure-sensitive adhesive tape or sheet having a constitution that it is formed with only a thermosetting adhesive and pressure-sensitive adhesive layer derived from the above thermosetting adhesive and pressure-sensitive adhesive composition. In this case, the adhesive layer is preferably formed by attaching predetermined members to both sides of the thermosetting adhesive and pressure-sensitive adhesive tape or sheet, followed by thermal hardening upon heating under pressure.

The thickness of the adhesive layer formed by thermal hardening of the above thermosetting adhesive and pressure-sensitive adhesive composition is preferably from 3 to 100 μm.

Figure 1:
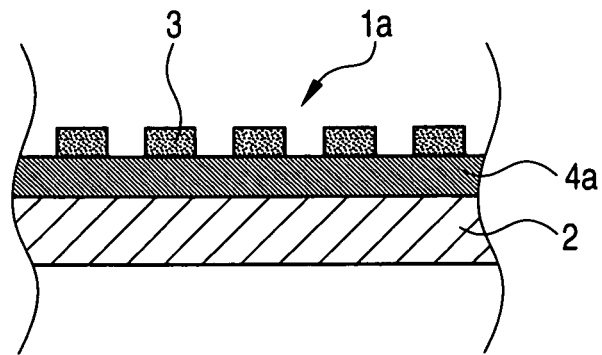
FIG. 1 is a schematic cross-sectional view illustrating an example of the wiring circuit board of the invention.

DESCRIPTION OF THE REFERENCE NUMERALS AND SIGNS 1a to 1f: wiring circuit boards
1d1 to 1d2: wiring circuit boards
1f1 to 1f2: wiring circuit boards
2: base insulating layer
3: conductor layer
4a to 4d: adhesive and pressure-sensitive adhesive layers (adhesive layers formed by thermal hardening of thermosetting adhesive and pressure-sensitive adhesive composition)
4e1 to 4e2: adhesive and pressure-sensitive adhesive layers
4f1 to 4f3: adhesive and pressure-sensitive adhesive layers
5: cover insulating layer
6: reinforcing plate

DETAILED DESCRIPTION OF THE INVENTION

The following will describe the modes for carrying out the invention in detail, if necessary, with reference to Drawings. In this regard, the same numerals are applied to the same members or sites.

[Thermosetting Adhesive and Pressure-Sensitive Adhesive Composition]

In the wiring circuit board of the invention, as the adhesive layer for adhering any members, an adhesive layer formed by thermal hardening of the following thermosetting adhesive and pressure-sensitive adhesive composition is used.

The thermosetting adhesive and pressure-sensitive adhesive composition: a thermosetting adhesive and pressure-sensitive adhesive composition which comprises 100 parts by weight of an acrylic polymer (X) containing, as monomer components, a (meth)acrylic acid alkyl ester (a) where the alkyl group has 2 to 14 carbon atoms in an amount of 60 to 75% by weight relative to the total amount of monomer components, a cyano group-containing monomer (b) in an amount of 20 to 35% by weight relative to the total amount of monomer components, and a carboxyl group-containing monomer (c) in an amount of 0.5 to 10% by weight relative to the total amount of monomer components and 1 to 20 parts by weight of a carbolic acid-based resorcinol-type phenol resin (Y) represented by the following formula (1):

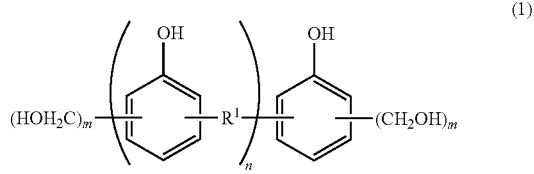

(1)

wherein $R^1$ represents —$CH_2$— or —$CH_2$—O—$CH_2$—, n is a positive integer, and m is an integer of 1 to 4.

[Acrylic Polymer (X)]

In the above thermosetting adhesive and pressure-sensitive adhesive composition, the acrylic polymer (X) is an acrylic polymer containing as monomer components, a (meth) acrylic acid alkyl ester (a) where the alkyl group has 2 to 14 carbon atoms [sometimes referred to as "(meth)acrylic acid $C_{2-14}$ alkyl ester"] in an amount of 60 to 75% by weight relative to the total amount of monomer components, a cyano group-containing monomer (b) in an amount of 20 to 35% by weight relative to the total amount of monomer components, and a carboxyl group-containing monomer (c) in an amount of 0.5 to 10% by weight relative to the total amount of monomer components.

[(Meth)Acrylic Acid $C_{2-14}$ Alkyl Ester (a)]

The (meth)acrylic acid $C_{2-14}$ alkyl ester (a) is not particularly limited as far as it is a (meth)acrylic acid alkyl ester (acrylic alkyl ester or methacrylic alkyl ester) where the alkyl group has 2 to 14 carbon atoms and examples of the (meth) acrylic acid $C_{2-14}$ alkyl ester (a) include ethyl (meth)acrylate, propyl (meth)acrylate, isopropyl (meth)acrylate, n-butyl (meth)acrylate, isobutyl (meth)acrylate, s-butyl (meth)acrylate, t-butyl (meth)acrylate, pentyl (meth)acrylate, isopentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, and the like.

As the (meth)acrylic acid $C_{2-14}$ alkyl ester (a), a (meth) acrylic acid alkyl ester having 4 to 12 carbon atoms is suitable and, in particular, n-butyl acrylate can be suitably used.

In this regard, the (meth)acrylic acid $C_{2-14}$ alkyl ester (a) may be composed of only one kind or may be composed of a mixture of two or more kinds. Namely, as the (meth)acrylic acid $C_{2-14}$ alkyl ester (a), at least one kind of (meth)acrylic acid alkyl ester selected from (meth)acrylic acid alkyl esters having 2 to 14 carbon atoms can be used.

In the invention, the (meth)acrylic acid $C_{2-14}$ alkyl ester (a) is used as a main monomer component for constituting the acrylic polymer (X). The ratio of the (meth)acrylic acid $C_{2-14}$ alkyl ester (a) is from 60 to 75% by weight relative to the total amount of the monomer components. The ratio of the (meth) acrylic acid $C_{2-14}$ alkyl ester (a) is preferably from 68 to 73% by weight relative to the total amount of the monomer components.

[Cyano Group-Containing Monomer (b)]

The cyano group-containing monomer (b) is not particularly limited as far as it is a monomer containing a cyano group. For example, acrylonitrile, methacrylonitrile, and the like may be mentioned. As the cyano group-containing monomer (b), acrylonitrile can be suitably used.

In this regard, the cyano group-containing monomer (b) may be composed of only one kind or may be composed of a mixture of two or more kinds.

In the invention, the cyano group-containing monomer (b) is used for improving heat resistance and adhesiveness. Therefore, it is important that the ratio of the cyano group-containing monomer (b) is from 20 to 35% by weight relative to the total amount of the monomer components. When the ratio of the cyano group-containing monomer (b) is less than 20% by weight, heat resistance is inferior. On the other hand, when the ratio is more than 35% by weight, the resulting polymer lacks flexibility. The ratio of the cyano group-containing monomer (b) is preferably from 25 to 32% by weight relative to the total amount of the monomer components.

[Carboxyl Group-Containing Monomer (c)]

The carboxyl group-containing monomer (c) is not particularly limited as far as it is a monomer containing a carboxyl group. For example, (meth)acrylic acid (acrylic acid, methacrylic acid), itaconic acid, maleic acid, fumaric acid, crotonic acid, and the like may be mentioned. Also, it is possible to use acid anhydrides of these carboxyl group-containing monomers (e.g., acid anhydride group-containing monomers such as maleic anhydride and itaconic anhydride) as carboxyl group-containing monomers. As the carboxyl group-containing monomer (c), acrylic acid, methacrylic acid, and itaconic acid can be suitably used.

In this regard, the carboxyl group-containing monomer (c) may be composed of only one kind or may be composed of a mixture of two or more kinds.

In the invention, the carboxyl group-containing monomer (c) is used for improving adhesiveness. Therefore, it is important that the ratio of the carboxyl group-containing monomer (c) is from 0.5 to 10% by weight relative to the total amount of the monomer components. When the ratio of the carboxyl group-containing monomer (c) is less than 0.5% by weight, an adhesiveness-improving effect is poor. On the other hand, when the ratio is more than 10% by weight, the resulting polymer lacks flexibility. The ratio of the carboxyl group-containing monomer (c) is preferably from 1 to 2% by weight relative to the total amount of the monomer components.

[Other Monomer Component]

As the monomer component constituting the acrylic polymer (X), if necessary, a monomer component copolymerizable with the (meth)acrylic acid $C_{2-14}$ alkyl ester (a), the cyano group-containing monomer (b), and the carboxyl group-containing monomer (c) (copolymerizable monomer) may be used. Examples of such copolymerizable monomer include methyl (meth)acrylate; (meth)acrylic acid $C_{15-20}$ alkyl esters such as pentadecyl (meth)acrylate, hexadecyl (meth)acrylate, heptadecyl (meth)acrylate, octadecyl (meth)acrylate, nonadecyl (meth)acrylate, and eicosyl (meth)acrylate; non-aromatic ring-containing (meth)acrylic acid esters such as (meth)acrylic acid cycloalkyl esters [cyclohexyl (meth)acrylate, etc.] and isobornyl (meth)acrylate; aromatic ring-containing (meth)acrylic acid esters such as (meth) acrylic acid aryl esters [phenyl (meth)acrylate, etc.], (meth) acrylic acid aryloxyalkyl esters [phenoxyethyl (meth)acrylate, etc.], and (meth)acrylic acid arylalkyl esters [(meth) acrylic acid benzyl ester]; epoxy group-containing acrylic monomers such as glycidyl (meth)acrylate and methylglycidyl (meth)acrylate; vinyl ester-based monomers such as vinyl acetate and vinyl propionate; styrene-based monomers such as styrene and α-methylstyrene; hydroxyl group-containing monomers such as hydroxyethyl (meth)acrylate, hydroxypropyl (meth)acrylate, and hydroxybutyl (meth) acrylate; alkoxyalkyl (meth)acrylate-based monomers such as methoxyethyl (meth)acrylate and ethyoxyethyl (meth) acrylate; aminoalkyl (meth)acrylate-based monomers such as aminoethyl (meth)acrylate, N,N-dimethylaminoethyl (meth) acrylate, and t-butylaminoethyl (meth)acrylate; (N-substituted)amide-based monomers such as (meth)acrylamide, N,N-dimethyl(meth)acrylamide, N-butyl(meth)acrylamide, and N-hydroxy(meth)acrylamide; olefin-based monomers such as ethylene, propylene, isoprene, and butadiene; vinyl ether-based monomers such as methyl vinyl ether; and the like.

Moreover, in the acrylic polymer (X), as the copolymerizable monomer, there may be used polyfunctional monomers such as hexanediol di(meth)acrylate, (poly)ethylene glycol di(meth)acrylate, (poly)propylene glycol di(meth)acrylate, neopentyl glycol di (meth)acrylate, pentaerythritol di(meth) acrylate, glycerin di(meth)acrylate, trimethylolpropane tri (meth)acrylate, pentaerythritol tri(meth)acrylate, dipentaerythritol hexa (meth)acrylate, epoxy acrylates, polyester acrylates, urethane acrylates, divinylbenzene, butyl dimethacrylate, hexyl di(meth)acrylate, and the like.

The acrylic polymer (X) can be prepared by a known or conventional polymerization method, for example, a liquid polymerization method, an emulsion polymerization method, a suspension polymerization, a bulk polymerization, or a polymerization method with ultraviolet irradiation.

A polymerization initiator, a chain transfer agent, and the like to be used at the polymerization of the acrylic polymer (X) are not particularly limited and may be suitably selected from among known or conventional ones. More specifically, examples of the polymerization initiator include azo-based polymerization initiators such as 2,2'-azobisisobutyonitrile, 2,2'-azobis(4-methoxy-2,4-dimethylvaleronitrile), 2,2'-azobis(2,4-dimethylvaleronitrile), 2,2'-azobis(2-methylbutyonitrile), 1,1'-azobis(cyclohexane-1-carbonitrile), 2,2'-azobis(2,4,4-trimethylpentane), and dimethyl-2,2'-azobis(2-methylpropionate); peroxide-based polymerization initiators such as benzoyl peroxide, t-butyl hydroperoxide, di-t-butyl peroxide, t-butyl peroxybenzoate, dicumyl peroxide, 1,1-bis (t-butylperoxy)-3,3,5-trimethylcyclohexane, and 1,1-bis(t-butylperoxy)cyclododecane; and the like. The polymerization initiator may be used singly or in combination of two or more thereof. The amount of the polymerization initiator to be used can be suitably selected from the range usually used.

Examples of the chain transfer agent include 2-mercaptoethanol, laurylmercaptan, glycidylmercaptan, mercaptoacetic acid, 2-ethylhexyl thioglycolate, 2,3-dimethylmercapto-1-propanol, α-methylstyrene dimer, and the like.

In solution polymerization, various solvents can be used. As such solvents, there may be mentioned organic solvents, for example, esters such as ethyl acetate and n-butyl acetate; aromatic hydrocarbons such as toluene and benzene; aliphatic hydrocarbons such as n-hexane and n-heptane; alicyclic hydrocarbons such as cyclohexane and methylcyclohexane; ketones such as methyl ethyl ketone and methyl isobutyl ketone; and the like.

The weight-average molecular weight of the acrylic polymer (X) is not particularly limited but, for example, may be suitably selected from the range of 100,000 to 1,000,000, preferably 200,000 to 800,000. The weight-average molecular weight of the acrylic polymer (X) can be controlled by the kind and amount of a polymerization initiator or a chain transfer agent, temperature and time at polymerization, and also a monomer concentration, a dropping rate of a monomer, and the like. In this regard, the weight-average molecular weight of the acrylic polymer (X) can be measured by gel permeation chromatography (GPC), for example. The measuring conditions at that time are not particularly limited and can be suitably selected from known measuring conditions.

[Carbolic Acid-Based Resorcinol-Type Phenol Resin (Y)]

In the above thermosetting adhesive and pressure-sensitive adhesive composition, a carbolic acid-based resorcinol-type phenol resin (Y) is used. The carbolic acid-based resorcinol-type phenol resin (Y) is a carbolic acid-based resorcinol-type phenol resin (Y) represented by the following formula (1):

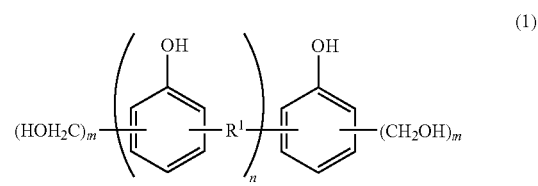

(1)

wherein $R^1$ represents —$CH_2$— or —$CH_2$—O—$CH_2$—, n is a positive integer, and m is an integer of 1 to 4.

In the above formula (1), n is not particularly limited as far as it is a positive integer but n is, for example, selected from the integers ranging from 1 to 20. Moreover, m is an integer of 1 to 4.

The carbolic acid-based resorcinol-type phenol resin (Y) preferably has a liquid form or a balsam form at 50° C.

The carbolic acid-based resorcinol-type phenol resin (Y) is used for imparting thermosetting property and heat resistance. The ratio of the carbolic acid-based resorcinol-type phenol resin (Y) is from 1 to 20 parts by weight, preferably from 5 to 15 parts by weight relative to 100 parts by weight of the above acrylic polymer (X). When the ratio of the carbolic acid-based resorcinol-type phenol resin (Y) is less than 1 part by weight relative to 100 parts by weight of the above acrylic polymer (X), the thermosetting property is insufficient. On the other hand, when the ratio is more than 20 parts by weight, the adhesiveness is lowered.

In this regard, when an alkylphenol resin represented by the following formula (2) is used as the phenol resin without using the carbolic acid-based resorcinol-type phenol resin (Y) represented by the above formula (1), adhesive properties become poor and a thermosetting adhesive and pressure-sensitive adhesive composition having an excellent adhesiveness is not obtained.

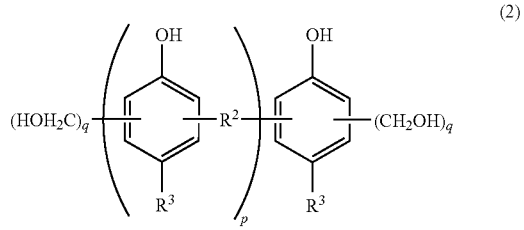

(2)

wherein $R^2$ represents —$CH_2$— or —$CH_2$—O—$CH_2$—, $R^3$ represents an alkyl group, p is a positive integer, and q is an integer of 1 to 3.

The alkyl group of $R^3$ in the above formula (2) is not particularly limited and examples thereof include alkyl groups such as a methyl group, an ethyl group, a propyl group, an isopropyl group, a butyl group, an isobutyl group, an s-butyl group, a t-butyl group, a pentyl group, a hexyl group, a heptyl group, and an octyl group. Moreover, p is not particularly limited as far as it is a positive integer but p is, for example, selected from the integers ranging from 1 to 20. Furthermore, q is an integer of 1 to 3.

[Thermosetting Adhesive and Pressure-Sensitive Adhesive Composition]

The thermosetting adhesive and pressure-sensitive adhesive composition in the invention contains the above acrylic polymer (X) and the above carbolic acid-based resorcinol-type phenol resin (Y). In the thermosetting adhesive and pressure-sensitive adhesive composition, the ratio of the acrylic polymer (X) to the carbolic acid-based resorcinol-type phenol resin (Y) is from 1 to 20 parts by weight, preferably from 5 to 15 parts by weight relative to 100 parts by weight of the above acrylic polymer (X), as mentioned above.

In the thermosetting adhesive and pressure-sensitive adhesive composition, in addition to the acrylic polymer (X) and the carbolic acid-based resorcinol-type phenol resin (Y), known additives such as antiaging agents, fillers, colorants (pigments, dyes, etc.), UV absorbents, antioxidants, crosslinking agents, tackifiers, plasticizers, softeners, surfactants, and antistatic agents may be contained, if necessary, within the range where the characteristics of the invention are not impaired.

The thermosetting adhesive and pressure-sensitive adhesive composition can be prepared by mixing the acrylic polymer (X) and the carbolic acid-based resorcinol-type phenol resin (Y) and, if necessary, various additives (antiaging agents, fillers, pigments, etc.).

In this regard, the acrylic polymer (X) and the carbolic acid-based resorcinol-type phenol resin (Y) may be used in a solution or dispersion state. When the acrylic polymer (X) is used in a solution state, a solvent is not particularly limited and, for example, can be selected from the solvents exemplified as the solvents for use in the preparation of the acrylic polymer (X) by solution polymerization. Moreover, when the carbolic acid-based resorcinol-type phenol resin (Y) is used in a solution state, a solvent is not particularly limited and, for example, monohydric alcohols such as methanol, ethanol, propanol, isopropanol, and butanol; polyhydric alcohols such as ethylene glycol; ketones; acetic acid esters; ethers; and the like may be used.

[Wiring Circuit Board]

The wiring circuit board of the invention at least comprises an electric insulator layer (sometimes referred to as "base insulating layer) and an electric conductor layer (sometimes referred to as "conductor layer") formed on the base electric insulator layer so as to form a predetermined circuit pattern, and further comprises an adhesive layer formed by thermal hardening of the above thermosetting adhesive and pressure-sensitive adhesive composition (sometimes referred to as "adhesive and pressure-sensitive adhesive layer"). In the above wiring circuit board, since the above adhesive and pressure-sensitive adhesive layer is used for adhering any members in the wiring circuit board each other, the layer is provided between one set or two or more sets of members to be adhered in the wiring circuit boards. Therefore, the wiring circuit board may have only one layer of the adhesive and pressure-sensitive adhesive layer or may have two or more layers thereof.

The wiring circuit board also comprises, if necessary, a covering electric insulator layer (sometimes referred to as "cover insulating layer") and a reinforcing plate provided on a surface of the base insulating layer opposite to the conductor layer in addition to the base insulating layer and the conductor layer formed on the base insulating layer so as to form a predetermined circuit pattern. Such individual members (base insulating layer, conductor layer, cover insulating layer, reinforcing plate, etc.) can be laminated in the form where one member is adhered to the other member through an adhesive layer. Therefore, as the site where the adhesive and pressure-sensitive adhesive layer is provided, there may be, for example, mentioned sites between the base insulating layer and the conductor layer, between the conductor layer and the cover insulating layer, and between the base insulating layer and the reinforcing plate.

Moreover, the wiring circuit board may have a multilayer structure wherein a plurality of wiring circuit boards are laminated. For example, such a wiring circuit board may be laminated in the form wherein one wiring circuit board is adhered to the other wiring circuit board through an adhesive layer. Therefore, in the case that the wiring circuit board has a multilayer structure wherein a plurality of wiring circuit boards are laminated, as the site where the adhesive and pressure-sensitive adhesive layer is provided, there may be, for example, mentioned sites between one set or two or more sets of wiring circuit boards.

Thus, in the wiring circuit board of the invention, the adhesive and pressure-sensitive adhesive layer may be provided at least any one site among the sites between the base insulating layer and the conductor layer, between the conductor layer and the cover insulating layer, between the base insulating layer and the reinforcing plate, and between individual wiring circuit boards. Of course, in the case that the wiring circuit board has a multilayer structure wherein a plurality of wiring circuit boards are laminated, the adhesive and pressure-sensitive adhesive layer may be provided between the base insulating layer and the conductor layer in single wiring circuit board or in a plurality of wiring circuit boards, between the conductor layer and the cover insulating layer in single wiring circuit board or in a plurality of wiring circuit boards, and between the base insulating layer and the reinforcing plate in single wiring circuit board or in a plurality of wiring circuit boards.

Specifically, as the constitution of the wiring circuit board, the following constitutions (1) to (5) or the like may be mentioned, for example.

Constitution (1): a constitution comprising a base insulating layer, a conductor layer formed on the base insulator layer so as to form a predetermined circuit pattern, and an adhesive and pressure-sensitive adhesive layer formed between the base insulating layer and the conductor layer, as shown in FIG. 1.

Figure 2:
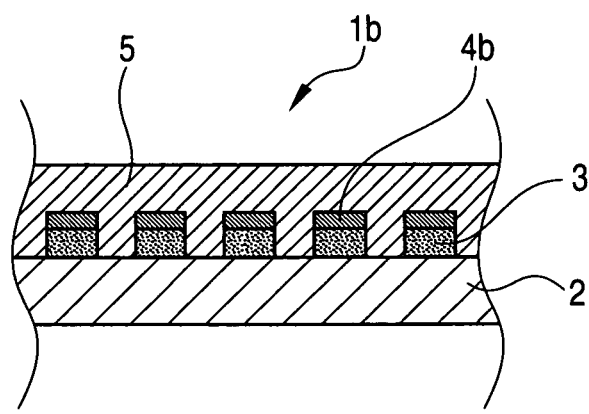
FIG. 2 is a schematic cross-sectional view illustrating an example of the wiring circuit board of the invention.

Constitution (2): a constitution comprising a base insulating layer, a conductor layer formed on the base insulator layer so as to form a predetermined circuit pattern, a cover insulating layer provided on the conductor layer, and an adhesive and pressure-sensitive adhesive layer formed between the conductor layer and the cover insulating layer, as shown in FIG. 2.

Figure 3:
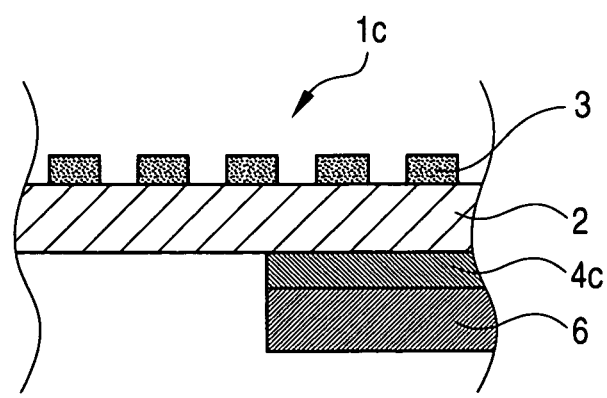
FIG. 3 is a schematic cross-sectional view illustrating an example of the wiring circuit board of the invention.

Constitution (3): a constitution comprising a base insulating layer, a conductor layer formed on the base insulator layer so as to form a predetermined circuit pattern, a reinforcing plate provided on the surface of the base insulator layer opposite to the conductor layer, and an adhesive and pressure-sensitive adhesive layer formed between the base insulating layer and the reinforcing plate, as shown in FIG. 3.

Figure 4:
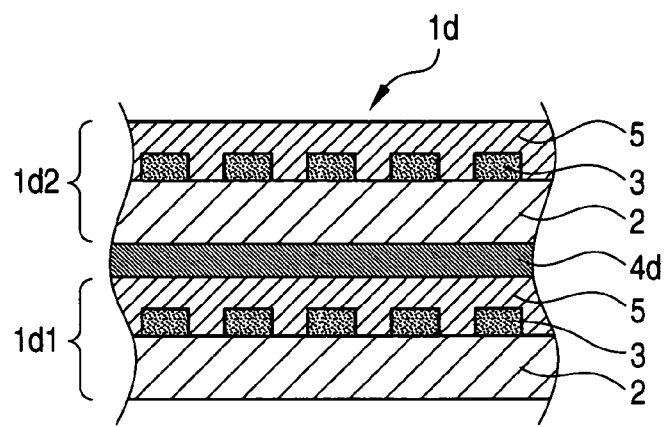
FIG. 4 is a schematic cross-sectional view illustrating an example of the wiring circuit board of the invention.

Constitution (4): a constitution wherein two layers of wiring circuit boards formed of a base insulating layer, a conductor layer formed on the base insulator layer so as to form a predetermined circuit pattern, and a cover insulating layer provided on the conductor layer are laminated and an adhesive and pressure-sensitive adhesive layer is formed between the two layers of the wiring circuit boards, as shown in FIG. 4.

Constitution (5): a constitution in combination of at least two constitutions selected from the constitutions (1) to (4).

FIG. 1 to FIG. 4 each is a schematic cross-sectional view illustrating an example of the wiring circuit board of the invention. In FIG. 1 to FIG. 4, $1a$ to $1d$ each is a wiring circuit board, $1d1$ is an upper side wiring circuit board in the wiring circuit board $1d$, $1d2$ is a lower side wiring circuit board in the wiring circuit board $1d$, 2 is a base insulating layer, 3 is a conductor layer, $4a$ to $4d$ each is an adhesive and pressure-sensitive adhesive layer, 5 is a cover insulating layer, and 6 is a reinforcing plate. In this regard, the adhesive and pressure-sensitive adhesive layers $4a$ to $4d$ each is an adhesive layer formed by thermal hardening of the above thermosetting adhesive and pressure-sensitive adhesive composition. The wiring circuit board $1a$ shown in FIG. 1 has a constitution wherein the conductor layer 3 having a predetermined circuit pattern is formed on the base insulating layer 2 through the adhesive and pressure-sensitive adhesive layer $4a$. The wiring circuit board $1b$ shown in FIG. 2 has a constitution wherein the conductor layer 3 having a predetermined circuit pattern is formed on the base insulating layer 2 and the cover insulating layer 5 is formed on the base insulating layer 2 and the conductor layer 3 in the form of covering the conductor layer 3 through the adhesive and pressure-sensitive adhesive layer $4b$ on the conductor layer 3. The wiring circuit board $1c$ shown in FIG. 3 has a constitution wherein the conductor layer 3 having a predetermined circuit pattern is formed on the base insulating layer 2 and the reinforcing plate 6 is formed on the surface of the base insulator layer 2 opposite to the conductor layer 3 through the adhesive and pressure-sensitive adhesive layer $4c$. The wiring circuit board $1d$ shown in FIG. 4 has a constitution wherein the conductor layer 3 having a predetermined circuit pattern is formed on the base insulating layer 2 and the adhesive and pressure-sensitive adhesive layer $4d$ is formed on the cover insulating layer 5 in the wiring circuit board $1d1$ having a constitution wherein the cover insulating layer 5 is formed on the base insulating layer 2 and the conductor layer 3 in the form of covering the conductor layer 3, and further the wiring circuit board $1d2$ having the same constitution as that of the above wiring circuit board $1d1$ is laminated on the adhesive and pressure-sensitive adhesive layer $4d$ in the form where the surface of the wiring circuit board $1d2$ at the base insulating layer side 2 comes into contact with the adhesive and pressure-sensitive adhesive layer $4d$.

Figure 5:
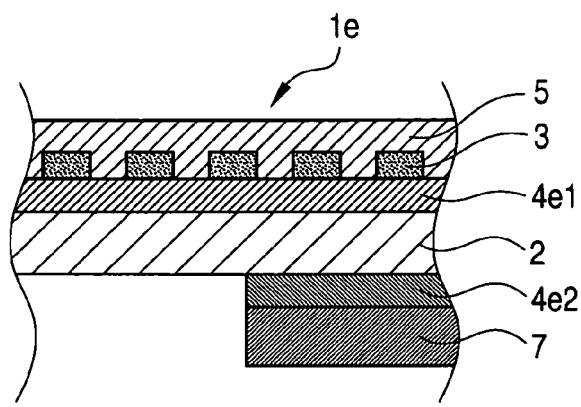
FIG. 5 is a schematic cross-sectional view illustrating an example of the wiring circuit board of the invention.
Figure 6:
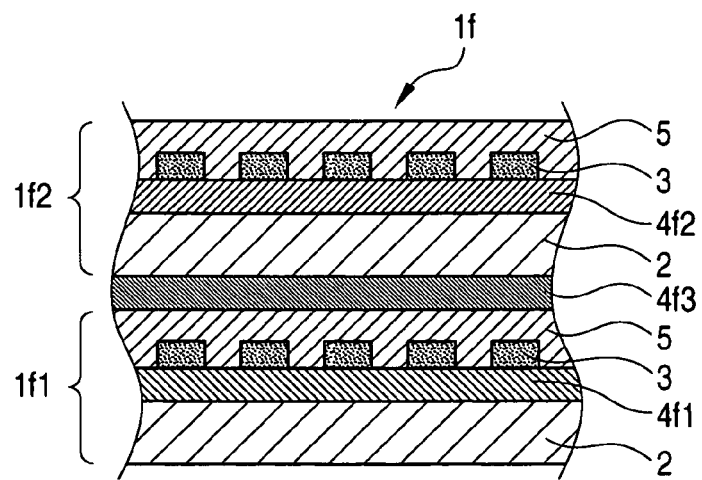
FIG. 6 is a schematic cross-sectional view illustrating an example of the wiring circuit board of the invention.

As the wiring circuit board having the above constitution (5), there may be, for example, mentioned a wiring circuit board having a constitution comprising a base insulating layer, a conductor layer formed on the base insulator layer so as to form a predetermined circuit pattern, a cover insulating layer formed on the conductor layer, an adhesive and pressure-sensitive adhesive layer formed between the base insulating layer and the conductor layer and cover insulating layer, a reinforcing plate provided on a surface of the base insulator layer opposite to the conductor layer, and an adhesive and pressure-sensitive adhesive layer formed between the base insulating layer and the reinforcing plate, as shown in FIG. 5 and a wiring circuit board having a constitution wherein two layers of wiring circuit boards formed of a base insulating layer, a conductor layer formed on the base insulator layer so as to form a predetermined circuit pattern, a cover insulating layer provided on the conductor layer, and an adhesive and pressure-sensitive adhesive layer formed between the base insulating layer and the conductor layer and cover insulating layer are laminated and an adhesive and pressure-sensitive adhesive layer is formed between the two layers of the wiring circuit boards, as shown in FIG. 6.

FIG. 5 and FIG. 6 each is a schematic cross-sectional view illustrating an example of the wiring circuit board of the invention. In FIG. 5 and FIG. 6, $1e$ and $1f$ each is a wiring circuit board, $1f1$ is an upper side wiring circuit board in the wiring circuit board $1f$, $1f2$ is a lower side wiring circuit board in the wiring circuit board $1f$, $4e1$, $4e2$, $4f1$, $4f2$, and $4f3$ each is an adhesive and pressure-sensitive adhesive layer, and 2, 3, 5, and 6 are the same as mentioned above. The wiring circuit board $1e$ shown in FIG. 5 has a constitution wherein the adhesive and pressure-sensitive adhesive layer $4e1$ is formed on the base insulating layer 2, the conductor layer 3 having a predetermined circuit pattern and the cover insulating layer 5 covering the conductor layer 3 are formed on the adhesive and pressure-sensitive adhesive layer $4e1$, further, the adhesive and pressure-sensitive adhesive layer $4e2$ is formed at a predetermined site on the surface of the base insulating layer 2 opposite to the conductor layer 3, and the reinforcing plate 6 is formed on the adhesive and pressure-sensitive adhesive layer $4e2$. The wiring circuit board $1f$ shown in FIG. 6 has a constitution wherein the adhesive and pressure-sensitive adhesive layer $4f3$ is formed on the cover insulating layer 5 in the wiring circuit board $1f1$ having a constitution wherein the adhesive and pressure-sensitive adhesive layer $4f1$ is formed on the base insulating layer 2 and the conductor layer 3 having a predetermined circuit pattern and the cover insulating layer 5 covering the conductor layer 3 are formed on the adhesive and pressure-sensitive adhesive layer 4/1, and further, the wiring circuit board 1/2 having a constitution wherein the adhesive and pressure-sensitive adhesive layer 4/2 is formed on the base insulating layer 2 and the conductor layer 3 having a predetermined circuit pattern and the cover insulating layer 5 covering the conductor layer 3 are formed on the adhesive and pressure-sensitive adhesive layer 4/2 is laminated on the adhesive and pressure-sensitive adhesive layer 4/3 in the form that the surface of the wiring circuit board 1/2 at the base insulating layer 2 side comes into contact with the adhesive and pressure-sensitive adhesive layer 4/3.

[Adhesive and Pressure-Sensitive Adhesive Layer]

In FIG. 1 to FIG. 4, the adhesive and pressure-sensitive adhesive layers 4a to 4d each is formed by thermal hardening of the above thermosetting adhesive and pressure-sensitive adhesive composition. The adhesive and pressure-sensitive adhesive layer may be formed by thermal hardening of the above thermosetting adhesive and pressure-sensitive adhesive composition after the composition is applied on a predetermined site but is preferably formed using a thermosetting adhesive and pressure-sensitive adhesive tape or sheet having a thermosetting adhesive and pressure-sensitive adhesive layer derived from the above thermosetting adhesive and pressure-sensitive adhesive composition. The thermosetting adhesive and pressure-sensitive adhesive layer in the thermosetting adhesive and pressure-sensitive adhesive tape or sheet is an adhesive layer in a non-hardened state before thermal hardening or a semi-hardened state (i.e., corresponding to the adhesive and pressure-sensitive adhesive layer before thermal hardening) and the adhesive and pressure-sensitive adhesive layer is formed by thermal hardening of the thermosetting adhesive and pressure-sensitive adhesive layer. Therefore, the adhesive and pressure-sensitive adhesive layer may be formed by drying and thermal hardening after application of the thermosetting adhesive and pressure-sensitive adhesive composition or may be formed by applying and drying the thermosetting adhesive and pressure-sensitive adhesive composition to form a thermosetting adhesive and pressure-sensitive adhesive layer and then thermally hardening the thermosetting adhesive and pressure-sensitive adhesive layer.

The heating temperature at the formation of the adhesive and pressure-sensitive adhesive layer by thermal hardening is not particularly limited as far as the temperature is a temperature capable of thermal hardening of the thermosetting adhesive and pressure-sensitive adhesive composition or the thermosetting adhesive and pressure-sensitive adhesive layer and is, for example, suitably selected from the range of 50 to 200° C., preferably 50 to 180° C., more preferably 100 to 160° C. Moreover, the heating time at the thermal hardening is, for example, suitably selected from the range of 30 seconds to 5 hours, preferably 1 minute to 3 hours, more preferably from 5 minutes to 2 hours.

In this regard, it is also possible to perform the thermal hardening at the formation of the adhesive and pressure-sensitive adhesive layer under pressure. The pressure at the thermal hardening may be suitably selected from the range of 0.1 to 10 MPa, preferably 0.5 to 8 MPa, more preferably 1 to 6 MPa.

Moreover, the thermosetting adhesive and pressure-sensitive adhesive composition or the adhesive and pressure-sensitive adhesive layer may be further cured after thermal hardening under the aforementioned thermal hardening conditions (heating temperature, heating time, pressure). The temperature at curing after thermal hardening is, for example, suitably selected from the range of 100 to 160° C., preferably 120 to 160° C. Moreover, the time at curing is suitably selected from the range of 1 to 5 hours, preferably 2 to 4 hours. The curing is usually performed under atmospheric pressure.

Thus, in the case that the adhesive and pressure-sensitive adhesive layer is formed using the thermosetting adhesive and pressure-sensitive adhesive tape or sheet, the layer can be formed by attaching predetermined members (a base insulating layer, a conductor layer, a cover insulating layer, a reinforced plate, a wiring circuit board, etc.) to both sides of the thermosetting adhesive and pressure-sensitive adhesive tape or sheet and then heating (particularly, heating under pressure) the thermosetting adhesive and pressure-sensitive adhesive layer to achieve thermal hardening.

The thickness of the adhesive and pressure-sensitive adhesive layer is not particularly limited and is, for example, selected from the range of 3 to 100 μm, preferably 5 to 50 μm, more preferably 10 to 30 μm. The adhesive and pressure-sensitive adhesive layer may have either form of a monolayer or a laminate.

The above thermosetting adhesive and pressure-sensitive adhesive tape or sheet may or may not have a base material as far as it has a thermosetting adhesive and pressure-sensitive adhesive layer derived from the above thermosetting adhesive and pressure-sensitive adhesive composition. Therefore, as the thermosetting adhesive and pressure-sensitive adhesive tape or sheet, there may be mentioned (1) a thermosetting adhesive and pressure-sensitive adhesive tape or sheet formed of a thermosetting adhesive and pressure-sensitive adhesive layer alone (a thermosetting adhesive and pressure-sensitive adhesive tape or sheet with no base material), (2) a thermosetting adhesive and pressure-sensitive adhesive tape or sheet wherein a thermosetting adhesive and pressure-sensitive adhesive layer is formed at least one side (double sides or one side) of a base material (a thermosetting adhesive and pressure-sensitive adhesive tape or sheet with a base material), or the like. As the thermosetting adhesive and pressure-sensitive adhesive tape or sheet, the thermosetting adhesive and pressure-sensitive adhesive tape or sheet having a constitution of the above (1) (i.e., a thermosetting adhesive and pressure-sensitive adhesive tape or sheet with no base material, which is formed of a thermosetting adhesive and pressure-sensitive adhesive layer alone) is suitable.

In this regard, in the case that the thermosetting adhesive and pressure-sensitive adhesive tape or sheet is a thermosetting adhesive and pressure-sensitive adhesive tape or sheet with a base material, it is sufficient that the thermosetting adhesive and pressure-sensitive adhesive layer derived from the above thermosetting adhesive and pressure-sensitive adhesive composition may be formed at least one side of a base material. Thus, a known pressure-sensitive adhesive layer, an adhesive layer, or a thermosetting adhesive and pressure-sensitive adhesive layer other than the above thermosetting adhesive and pressure-sensitive adhesive layer may be formed on the other side of the base material.

Moreover, the thermosetting adhesive and pressure-sensitive adhesive tape or sheet may be formed in the form wound into a roll or may be formed in the sheet-laminated form. Namely, the thermosetting adhesive and pressure-sensitive adhesive tape or sheet may have a sheet-like, tape-like, or the like form. In the case that the thermosetting adhesive and pressure-sensitive adhesive tape or sheet has the form wound into a roll, it may have a form that the thermosetting adhesive and pressure-sensitive adhesive layer is wound into a roll in a state that the thermosetting adhesive and pressure-sensitive adhesive layer is protected by a release treatment layer formed on the backside of a separator or the base material.

In the thermosetting adhesive and pressure-sensitive adhesive tape or sheet, since the thermosetting adhesive and pressure-sensitive adhesive layer is formed of the thermosetting adhesive and pressure-sensitive adhesive composition as described above, the layer has pressure-sensitive adhesiveness capable of being adhered to an adherend at ordinary temperature and also have adhesiveness capable of being strongly adhered thereto with increased adhesive strength through a hardening reaction induced by heating.

The thickness of the thermosetting adhesive and pressure-sensitive adhesive layer may be, for example, selected from the range of 3 to 100 μm, preferably 5 to 50 μm, more preferably 10 to 30 μm. The thermosetting adhesive and pressure-sensitive adhesive layer may have either form of a monolayer or a laminate.

In the invention, the thermosetting adhesive and pressure-sensitive adhesive layer desirably has a storage modulus at 23° C. of $1\times10^6$ to $1\times10^8$ Pa, preferably $1\times10^7$ to $8\times10^7$ Pa, more preferably $1.2\times10^7$ to $5\times10^7$ Pa. When the storage modulus at 23° C. is less than $1\times10^6$, the pressure-sensitive adhesiveness is enhanced but the heat resistance tends to be lowered. On the other hand, when it is more than $1\times10^8$ Pa, the heat resistance is enhanced but the pressure-sensitive adhesiveness tends to be lowered. In this regard, the storage modulus of the thermosetting adhesive and pressure-sensitive adhesive layer can be measured under measuring conditions of frequency: 1 Hz and strain: 5% using a viscoelasticity-measuring apparatus of an apparatus trade name "ARES" (manufactured by Rheometrics).

In the thermosetting adhesive and pressure-sensitive adhesive tape or sheet, the thermosetting adhesive and pressure-sensitive adhesive layer may be protected by a known release liner.

In the case that the thermosetting adhesive and pressure-sensitive adhesive tape or sheet has a base material, the base material is not particularly limited and there may be, for example, used paper-based base materials such as paper; fiber-based base materials such as fabrics, non-woven fabrics, and nets; metal-based base materials such as metal foils and metal plates; plastic-based base materials such as films and sheets derived from various resins (olefinic resins, polyester-based resins, polyvinyl chloride-based resins, vinyl acetate-based resins, amide-based resins, polyimide-based resins, polyether ether ketones, polyphenylene sulfide, etc.); rubber-based base materials such as rubber sheets; and suitable thin bodies, e.g., foams such as foam sheets and laminates thereof (particularly, laminates of plastic base materials with the other base materials, laminates of plastic films or sheets, etc.). The thickness of the base material is not particularly limited and is, for example, from about 10 to 500 μm, preferably from 12 to 200 mm, more preferably from 15 to 100 μm. The base material may have either monolayer form or multilayer form. Moreover, the base material may be subjected to various treatments such as backside treatment, antistatic treatment, and undercoat treatment.

In this regard, the thermosetting adhesive and pressure-sensitive adhesive tape or sheet may have the other layers (e.g., interlayers, undercoat layers, etc) in the range where the advantage of the invention is not impaired.

The thermosetting adhesive and pressure-sensitive adhesive tape or sheet can be produced according to usual processes for producing pressure-sensitive adhesive tapes or sheets. For example, in the case that the thermosetting adhesive and pressure-sensitive adhesive tape or sheet is a thermosetting adhesive and pressure-sensitive adhesive tape or sheet with no base material, the tape or sheet can be manufactured by a method of applying the above thermosetting adhesive and pressure-sensitive adhesive composition on a release surface of a release liner so that the thickness after drying becomes predetermined thickness and drying it. At the application of the thermosetting adhesive and pressure-sensitive adhesive composition, there may be used a conventional coating machine, e.g., a gravure roll coater, a reverse roll coater, a kiss roll coater, a dip roll coater, a bar coater, a knife coater, a spray coater, or the like.

At attaching the thermosetting adhesive and pressure-sensitive adhesive layer in the above thermosetting adhesive and pressure-sensitive adhesive tape or sheet to an adherend by temporary attachment before hardening upon heating, it can be attached to the adherend with temporary attachment utilizing its pressure-sensitive adhesiveness and, after the attachment by pressure-sensitive adhesion, can be strongly adhered to the adherend by curing upon heating. Furthermore, the thermosetting adhesive and pressure-sensitive adhesive layer can exhibit an excellent heat resistance (particularly heat resistance after heat and humidity treatment) after thermal hardening.

[Base Insulating Layer]

The base insulating layer is an electric insulating layer formed of an electric insulating material. The electric insulating material for the formation of the base insulating layer is not particularly limited and is suitably selected from among electric insulating materials used in known wiring circuit boards. Specifically, examples of the electric insulating material include plastic materials such as polyimide-based resins, acrylic resins, polyether nitrile resins, polyether sulfone-based resins, polyester-based resins (polyethylene terephthalate-based resins, polyethylene naphthalate-based resins), polyvinyl chloride-based resins, polyphenylene sulfide-based resins, polyether ether ketone-based resins, polyamide-based resins (so-called "aramide resin", etc.), polyarylate-based resins, polycarbonate-based resins, and liquid crystalline polymers; ceramic materials such as alumina, zirconia, soda glass, and quartz glass; various composite materials having an electric insulating property (non-conductivity); and the like. The electric insulating material may be used singly or in combination of two or more thereof.

In the invention, as the electric insulating materials, plastic materials (particularly, polyimide-based resins) are suitable. Therefore, the base insulating layer is preferably formed of a plastic film or sheet (particularly, a film or sheet made of a polyimide-based resin).

In this regard, as the electric insulating material, an electric insulating material having photosensitivity (e.g., a photosensitive plastic material such as a photosensitive polyimide-based resin) may be used.

The base insulating layer may have either form of a monolayer or a laminate. The surface of the base insulating layer may be subjected to various surface treatments (e.g., corona-discharge treatment, plasma treatment, roughing treatment, hydrolysis treatment, etc.).

The thickness of the base insulating layer is not particularly limited and is, for example, from 3 to 100 μm, preferably from 5 to 50 μm, more preferably from 10 to 30 μm.

[Conductor Layer]

The conductor layer is a conductor layer formed of a conductive material. The conductor layer is formed so that a predetermined circuit pattern is formed on the above base insulating layer. The conductive material for the formation of such a conductor layer is not particularly limited and can be suitably selected from among conductive materials used in known wiring circuit boards. Specifically, examples of the conductive material include metal materials such as copper, nickel, gold, chromium, other various alloys (e.g., solder), and platinum; conductive plastic materials; and the like. The conductive material may be used singly or in combination of two or more thereof. In the invention, as the conductive material, a metal material (particularly, copper) is suitable.

The conductor layer may have either form of a monolayer or a laminate. The surface of the conductor layer may be subjected to various surface treatments.

The thickness of the conductor layer is not particularly limited and is, for example, from 1 to 50 μm, preferably from 2 to 30 μm, more preferably from 3 to 20 μm.

The formation method of the conductor layer is not particularly limited and may be suitably selected from known formation methods (e.g., known patterning methods such as a subtractive method, an additive method, and a semi-additive method). For example, in the case that the conductor layer is formed on the surface of a base insulating layer through an adhesive and pressure-sensitive adhesive layer, the conductor layer can be formed by forming a conductive material layer derived from a plate made of a conductive material (e.g., a metal foil) through a thermosetting adhesive and pressure-sensitive adhesive layer on the surface of a base insulating layer, subjecting the thermosetting adhesive and pressure-sensitive adhesive layer to thermal hardening treatment to form the above conductive material layer on the base insulating layer through the adhesive and pressure-sensitive adhesive layer, and then subjecting the above conductive material layer to etching treatment by treatment with a chemical liquid so as to have a predetermined circuit pattern. Moreover, in the case that the conductor layer is directly formed on the surface of a base insulating layer, the conductor layer can be formed by plating or depositing a conductive material on a base insulating layer utilizing an electroless plating method, an electrolytic plating method, a vacuum deposition method, a spattering method, or the like so as to have a predetermined circuit pattern.

[Cover Insulating Layer]

The cover insulating layer is a covering electric insulator layer (protective electric insulator layer) which is formed of an electric insulating material and covers the conductor layer. The cover insulating layer is provided according to necessity and is not necessarily provided. The electric insulating material for forming the cover insulating layer is not particularly limited and is suitably selected from among the electric insulating materials for use in known wiring circuit boards, as in the case of the base insulating layer. Specifically, examples of the electric insulating material for forming the cover insulating layer include electric insulating materials exemplified as the electric insulating materials for forming the above base insulating layer and the like and, as in the case of the base insulating layer, plastic materials, particularly polyimide-based resins are preferable. The electric insulating material for forming the cover insulating layer may be used singly or in combination of two or more thereof.

The cover insulating layer may have either form of a monolayer or a laminate. The surface of the cover insulating layer may be subjected to various surface treatments (e.g., corona-discharge treatment, plasma treatment, roughing treatment, hydrolysis treatment, etc.).

The thickness of the cover insulating layer is not particularly limited and may be, for example, suitably selected from the range of 3 to 100 μm, preferably 5 to 50 μm, more preferably 10 to 30 μm.

The method for forming the cover insulating layer is not particularly limited and may be suitably selected from known formation methods, e.g., a method of applying a liquid or a melt containing an electric insulating material and drying it, a method of laminating a film or sheet which corresponds the shape of the conductor layer and is formed of an electric insulating material.

[Reinforcing Plate]

The reinforcing plate is provided on the surface of the base insulating layer opposite to the conductor layer (backside). The reinforcing plate is provided according to necessity and is not necessarily provided. The reinforcing plate material is not particularly limited and may be suitably selected from among the reinforcing plate materials for forming known reinforcing plates. The reinforcing plate material may be either conductive or non-conductive. Specifically, examples of the reinforcing plate material include metal materials such as stainless steel, aluminum, copper, iron, gold, silver, nickel, titanium, and chromium; plastic materials such as polyimide-based resins, acrylic resins, polyether nitrile resins, polyether sulfone-based resins, polyester-based resins (polyethylene terephthalate-based resins, polyethylene naphthalate-based resins), polyvinyl chloride-based resins, polyphenylene sulfide-based resins, polyether ether ketones-based resins, polyamide-based resins (so-called "aramide resin", etc.), polyarylate-based resins, polycarbonate-based resins, epoxy-based resins, glass epoxy resins, and liquid polymers; inorganic materials such as alumina, zirconia, soda glass, quartz glass, and carbon; and the like. The reinforcing plate material may be used singly or in combination of two or more thereof.

As the reinforcing plate materials, metal materials such as stainless steel and aluminum and plastic materials such as polyimide-based resins are preferable. In particular, stainless and aluminum may be preferably used. Therefore, the reinforcing plate is preferably formed of a metal foil or metal plate (stainless steel foil or stainless steel plate, aluminum foil or aluminum plate, or the like) or a plastic film or sheet (polyimide-based resin film or sheet).

The reinforcing plate may have either form of a monolayer or a laminate. The surface of the reinforcing plate may be subjected to various surface treatments.

The thickness of the reinforcing plate is not particularly limited and may be, for example, suitably selected from the range of 50 to 2000 μm, preferably 100 to 1000 μm.

[Wiring Circuit Board Having a Multilayer Structure]

The wiring circuit board having a multilayer structure has a structure wherein a plurality of wiring circuit boards are laminated. Each wiring circuit board in the wiring circuit board having a multilayer structure at least comprises a base insulating layer and a conductor layer and also comprises, if necessary, a cover insulating layer, a reinforcing plate, and the like (particularly, a cover insulating layer). Furthermore, it comprises an adhesive and pressure-sensitive adhesive layer between one set or two or more sets of the wiring circuit boards.

In each wiring circuit board in such a wiring circuit board having a multilayer structure, individual members (base insulating layer, conductor layer, cover insulating layer, reinforcing plate, and the like) may be laminated in an adhered state through the above adhesive and pressure-sensitive adhesive layer(s) or may be laminated in an adhered state through an adhesive layer other than the above adhesive and pressure-sensitive adhesive layer. Furthermore, they may be laminated in a strongly adhered state by the other method. With regard to the wiring circuit board having a multilayer structure, it is sufficient that at least one set of the wiring circuit boards may be laminated each other in an adhered state through the adhesive and pressure-sensitive adhesive layer and the other wiring circuit boards may be laminated each other in an adhered state through an adhesive layer other than the above adhesive and pressure-sensitive adhesive layer or may be laminated each other in a strongly adhered state by the other method.

In this regard, the number of the wiring circuit boards in the wiring circuit board having a multilayer structure (the number of the layers in the multilayer) is not particularly limited as far as the number is 2 or more.

In the wiring circuit board of the invention, as far as the adhesive and pressure-sensitive adhesive layer is provided between at least one set of any members for adhering the members each other, an adhesive layer derived from the other adhesive may be provided for adhering the other members each other. Such an adhesive may be suitably selected from known adhesives, for example, thermosetting adhesives such as polyimide-based thermosetting adhesives, epoxy-based thermosetting adhesives, epoxy-nitrile butyl rubber-based thermosetting adhesives, epoxy-acrylic rubber-based thermosetting adhesives, acrylic thermosetting adhesives, butyral-based thermosetting adhesives, and urethane-based thermosetting adhesives; synthetic rubber-based adhesives; pressure-sensitive adhesives such as acrylic pressure-sensitive adhesives; and the like. From the viewpoint of heat resistance, thermosetting adhesives may be preferably used.

As mentioned above, the wiring circuit board of the invention has an adhesive and pressure-sensitive adhesive layer which is an adhesive layer formed by thermal hardening of the above thermosetting adhesive and pressure-sensitive adhesive composition as an adhesive layer for adhering any members each other. Therefore, at adhering the members each other, the members are attached in a predetermined positional relation with positioning by temporary attachment at ordinary temperature (e.g., 10 to 30° C.) utilizing the thermosetting adhesive and pressure-sensitive adhesive layer (adhesive layer wherein the thermosetting adhesive and pressure-sensitive adhesive composition is in a non-hardened state or semi-hardened state) which is an adhesive and pressure-sensitive adhesive layer before thermal hardening, then the thermosetting adhesive and pressure-sensitive adhesive layer is hardened by heat treatment, and the members are strongly adhered each other, whereby the wiring circuit board can be manufactured. Accordingly, with regard to the wiring circuit board of the invention, the members can be temporarily attached each other at ordinary temperature and can be easily reattached on this occasion, so that the attaching operation becomes very simple and convenient and hence the wiring circuit board can be manufactured with excellent attaching workability. Moreover, after the members are attached to each other with positioning by temporary attachment, the members attached by pressure-sensitive adhesion can be strongly adhered by inducing a hardening reaction upon heating, so that a wiring circuit board wherein the members are adhered each other with an excellent adhesiveness can be manufactured. Thus, the wiring circuit board is produced with excellent workability and productivity.

The wiring circuit board of the invention is not particularly limited as far as it is a wiring circuit board but a flexible printed circuit board (FPC) is preferable. The wiring circuit board of the invention can be preferably used as a wiring circuit board for use in various electronic devices.

Since the wiring circuit board of the invention has the above constitutions, predetermined members are attached each other with positioning by temporary attachment at ordinary temperature and, after the attachment in a predetermined positional relation, are adhered with an excellent adhesiveness. Therefore, the wiring circuit board is produced with excellent workability and productivity.

The following will describe the invention in detail with reference to Examples but the invention is by no means limited thereto.

EXAMPLE 1

A methanol solution of 10 parts by weight of a trade name "Smilite Resin PR-51283" (manufactured by Sumitomo Bakelite Co., Ltd.) as a carbolic acid-based resorcinol-type phenol resin having a liquid form at 50° C. was mixed into an ethyl acetate solution of 100 parts by weight of an acrylic polymer (a copolymer of butyl acrylate (BA)/acrylonitrile (AN)/acrylic acid (AA)=69:30:1 (by weight)] and the whole was stirred to prepare a thermosetting adhesive and pressure-sensitive adhesive composition solution. Namely, the thermosetting adhesive and pressure-sensitive adhesive composition solution contains 100 parts by weight of the acrylic polymer and 10 parts by weight of the carbolic acid-based resorcinol-type phenol resin.

The thermosetting adhesive and pressure-sensitive adhesive composition solution was applied on one surface of a trade name "Kapton" (a film or sheet made of a polyimide manufactured by E. I. du Pont; thickness: 25 am) with a roll coater so that the thickness after drying became 15 μm. The whole was dried at 100° C. for 3 minutes to form an adhesive and pressure-sensitive adhesive layer in a semi-hardened state (thermosetting adhesive and pressure-sensitive adhesive layer).

A trade name "Espanex SC18-25-00CE" (manufactured by Nippon Steel Chemical Co., Ltd.) was hot-pressed (pressed under heating) on the above thermosetting adhesive and pressure-sensitive adhesive layer in the form that the copper foil surface came into contact with the thermosetting adhesive and pressure-sensitive adhesive layer under conditions of temperature: 150° C., pressure: 40 kgf/cm$^2$ (3.9 MPa), and time: 60 minutes, and the whole was attached each other by curing at 150° C. for 3 hours, whereby a flexible printed circuit board (FPC) having a layer structure of a trade name "Kapton" (manufactured by E. I. du Pont)/an adhesive layer formed by thermal hardening of the above thermosetting adhesive and pressure-sensitive adhesive composition/a trade name "Espanex SC18-25-00CE" (manufactured by Nippon Steel Chemical Co., Ltd.) was manufactured.

(Evaluation)

With regard to the FPC obtained in Example 1, the adhesive strength of the adhesive layer, the amount of resin flow, heat resistance to soldering were measured or evaluated according to the following measurement methods or evaluation method.

(Measurement Method of Adhesive Force)

After the FPC was cut into a width of 1 cm to prepare a test piece, 90°-peeling adhesive force on the test piece (peeling rate: 50 mm/min, 23° C.; N/cm) was measured by a method of pulling the test piece from the copper foil side using an apparatus trade name "TCM-1KNB" (manufactured by Minebea Co., Ltd.). The measurement or evaluation results are shown in a column of "Adhesive force (N/cm)" of Table 1.

(Amount of Resin Flow)

Using a digital microscope (a trade name "VH6200" manufactured by KEYENCE), the length of the thermosetting adhesive and pressure-sensitive adhesive forced out from the FPC was measured. The measurement or evaluation results are shown in a column of "Amount of resin flow" of Table 1.

(Heat Resistance to Soldering)

In the same manner as in the measurement method of the above adhesive force, the FPC was cut into a width of 1 cm to prepare a test piece. After the test piece was pre-heated at a temperature of 100° C. for 1 hour, a state of exfoliation and blistering of the adhesive layer was visually observed when the test piece was heated under a temperature profile of conditions of a peak temperature: 260° C. and time: 10 seconds in a heating furnace with IR (IR heating furnace). Thus, heat resistance to soldering was evaluated as follows: "◯" when exfoliation and blistering in the adhesive layer were not observed; "X" when exfoliation or blistering in the adhesive layer was observed. The measurement or evaluation results are shown in a column of "Heat resistance to soldering" of Table 1.

TABLE 1

|  | Adhesive force (N/cm) | Amount of resin flow (mm) | Heat resistance to soldering |
|---|---|---|---|
| Example 1 | 6 | 0.04 | ◯ |

While the invention has been described in detail and with reference to specific embodiments thereof, it will be apparent to one skilled in the art that various changes and modifications can be made therein without departing from the spirit and scope thereof.

What is claimed is:

1. A wiring circuit board at least comprising an electric insulator layer and an electric conductor formed on the electric insulator layer so as to form a predetermined circuit pattern, which further comprises an adhesive layer formed by thermal hardening of the following thermosetting adhesive and pressure-sensitive adhesive composition:

the thermosetting adhesive and pressure-sensitive adhesive composition being a thermosetting adhesive and pressure-sensitive adhesive composition which comprises 100 parts by weight of an acrylic polymer (X) containing, as monomer components, a (meth)acrylic acid alkyl ester (a) where the alkyl group has 2 to 14 carbon atoms in an amount of 60 to 75% by weight relative to the total amount of monomer components, a cyano group-containing monomer (b) in an amount of 20 to 35% by weight relative to the total amount of monomer components, and a carboxyl group-containing monomer (c) in an amount of 0.5 to 10% by weight relative to the total amount of monomer components and 1 to 20 parts by weight of a carbolic acid-based resorcinol-type phenol resin (Y) represented by the following formula (1):

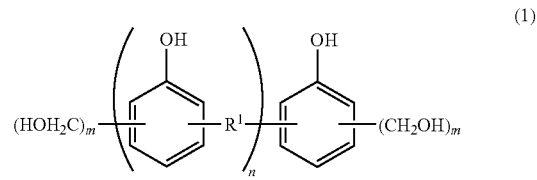

wherein $R^1$ represents —$CH_2$— or —$CH_2$—O—$CH_2$—, n is a positive integer, and m is an integer of 1 to 4.

2. The wiring circuit board according to claim 1, which has the adhesive layer formed by thermal hardening of the above thermosetting adhesive and pressure-sensitive adhesive composition at at least one site among sites between the electric insulator layer and the electric conductor layer, between the electric conductor layer and a covering electric insulator layer provided on the electric conductor layer, and between the electric insulator layer and a reinforcing plate provided on the surface of the electric insulator layer opposite to the electric conductor layer.

3. The wiring circuit board according to claim 1, wherein the wiring circuit board has a multilayer structure where a plurality of wiring circuit boards are laminated and has the adhesive layer formed by thermal hardening of the thermosetting adhesive and pressure-sensitive adhesive composition between at least two wiring circuit boards.

4. The wiring circuit board according to claim 1, wherein the adhesive layer formed by thermal hardening of the above thermosetting adhesive and pressure-sensitive adhesive composition is formed using a thermosetting adhesive and pressure-sensitive adhesive tape or sheet having a constitution that it is formed with only a thermosetting adhesive and pressure-sensitive adhesive layer derived from the above thermosetting adhesive and pressure-sensitive adhesive composition.

5. The wiring circuit board according to claim 4, wherein the adhesive layer formed by thermal hardening of the above thermosetting adhesive and pressure-sensitive adhesive composition is formed by attaching predetermined members to both sides of the thermosetting adhesive and pressure-sensitive adhesive tape or sheet, followed by thermal hardening upon heating under pressure.

6. The wiring circuit board according to claim 1, wherein thickness of the adhesive layer formed by thermal hardening of the above thermosetting adhesive and pressure-sensitive adhesive composition is from 3 to 100 μm.

* * * * *